United States Patent
Schulz

(10) Patent No.: US 9,310,554 B2
(45) Date of Patent: *Apr. 12, 2016

(54) INTEGRATED CIRCUIT INCLUDING NON-PLANAR STRUCTURE AND WAVEGUIDE

(71) Applicant: Infineon Technologies AG, Neubiberg (DE)

(72) Inventor: Thomas Schulz, Heverlee (BE)

(73) Assignee: Infineon Technologies AG, Neubiberg (DE)

( * ) Notice: Subject to any disclaimer, the term of this patent is extended or adjusted under 35 U.S.C. 154(b) by 88 days.

This patent is subject to a terminal disclaimer.

(21) Appl. No.: 14/224,877

(22) Filed: Mar. 25, 2014

(65) Prior Publication Data

US 2014/0205233 A1    Jul. 24, 2014

Related U.S. Application Data

(62) Division of application No. 11/835,688, filed on Aug. 8, 2007, now Pat. No. 8,682,116.

(51) Int. Cl.
| | |
|---|---|
| *G02B 6/12* | (2006.01) |
| *H01L 31/107* | (2006.01) |
| *G02B 6/10* | (2006.01) |
| *G02B 6/42* | (2006.01) |
| *H01L 31/00* | (2006.01) |

(Continued)

(52) U.S. Cl.
CPC .............. *G02B 6/12* (2013.01); *H01L 31/0232* (2013.01); *H01L 31/103* (2013.01); *H01L 31/105* (2013.01); *H01L 31/107* (2013.01); *H01L 31/165* (2013.01)

(58) Field of Classification Search
CPC .............. G02B 6/12; G02B 6/10; G02B 6/42; H01L 31/0232; H01L 31/103; H01L 31/105; H01L 31/107; H01L 31/165; H01L 31/00; G01J 1/04
USPC ............. 385/12, 14, 31–32, 39, 49, 129–132; 257/79–86, 98–99, 192, 432, 443, 446, 257/449, 452, 466, 292; 250/14.1, 227.11, 250/239, 338.4, 214.1, 216
See application file for complete search history.

(56) References Cited

U.S. PATENT DOCUMENTS

| | | |
|---|---|---|
| 6,413,802 B1 | 7/2002 | Hu et al. |
| 6,553,157 B2 | 4/2003 | Schultz et al. |

(Continued)

FOREIGN PATENT DOCUMENTS

DE    199 42 692 A1    4/2001

OTHER PUBLICATIONS

Non-Final Office Action mailed Apr. 27, 2010 in U.S. Appl. No. 11/835,688.

(Continued)

*Primary Examiner* — Akm Enayet Ullah
*Assistant Examiner* — Michael Mooney
(74) *Attorney, Agent, or Firm* — Dicke, Billig & Czaja, PLLC

(57) ABSTRACT

One embodiment provides an integrated circuit including a first non-planar structure and a waveguide configured to provide electromagnetic waves to the first non-planar structure. The first non-planar structure provides a first signal in response to at least some of the electromagnetic waves.

20 Claims, 6 Drawing Sheets

(51) Int. Cl.
*G01J 1/04* (2006.01)
*H01L 31/0232* (2014.01)
*H01L 31/103* (2006.01)
*H01L 31/105* (2006.01)
*H01L 31/16* (2006.01)

(56) References Cited

U.S. PATENT DOCUMENTS

| | | |
|---|---|---|
| 7,018,876 B2 | 3/2006 | Mathew et al. |
| 7,085,443 B1 | 8/2006 | Gunn, III et al. |
| 7,094,650 B2 | 8/2006 | Chaudhary et al. |
| 7,119,384 B2 | 10/2006 | Popp et al. |
| 7,192,876 B2 | 3/2007 | Mathew et al. |
| 7,349,614 B2 | 3/2008 | Doan |
| 7,453,132 B1 | 11/2008 | Gunn et al. |
| 8,682,116 B2 * | 3/2014 | Schulz ............... 385/14 |
| 2002/0110329 A1 | 8/2002 | Schulz et al. |
| 2004/0217408 A1 | 11/2004 | Hofmann et al. |
| 2006/0091490 A1 | 5/2006 | Chen et al. |
| 2006/0284273 A1 | 12/2006 | Ho et al. |

OTHER PUBLICATIONS

Final Office Action mailed Oct. 25, 2010 in U.S. Appl. No. 11/835,688.
Non-Final Office Action mailed Dec. 18, 2012 in U.S. Appl. No. 11/835,688.

* cited by examiner

INTEGRATED CIRCUIT INCLUDING NON-PLANAR STRUCTURE AND WAVEGUIDE

CROSS-REFERENCE TO RELATED APPLICATIONS

This Utility Patent Application is a divisional of U.S. patent application Ser. No. 11/835,688, filed Aug. 8, 2007, which is incorporated herein by reference.

BACKGROUND

Photodetectors are sensors for detecting electromagnetic waves or light. Often, photodetectors are quantum devices in which an individual photon produces a discrete effect. Photodetector applications vary according to electromagnetic wavelength, optical power, dynamic range, linearity, quantum efficiency, bandwidth, size, robustness, and cost. Photodetector types include chemical detectors such as photographic plates, photoresistors that change resistance if illuminated, photodiodes, and phototransistors.

Typically, a photodiode includes a photon detection region, such as the depletion region of a p-n junction, the intrinsic region of a p-i-n structure, or the absorption region of an avalanche diode. If light of sufficient energy strikes the photodiode, the light excites electrons thereby creating mobile electrons and positively charged electron holes. If absorption of the light occurs in the photon detection region or one diffusion length away from it, carriers are swept from the photo detection region to produce photocurrent. This photocurrent is a reverse diode current that varies linearly with illumination above the dark current region. Photodiodes can be operated under zero bias in photovoltaic mode or under reverse bias in photoconductive mode.

Some photodiodes are manufactured via planar metal oxide semiconductor field effect transistor (MOSFET) technologies. Typically, a photodiode is situated in its own active area, such as an n-doped well or an isolated silicon island/mesa having a different potential than the grounded substrate, which uses valuable real estate on the wafer. Manufacturing vertical photodiodes in planar MOSFET technologies increases the complexity of the MOSFET process, since an additional doping implantation step is needed to provide p-n junctions at different depths of the active area. In addition, planar MOSFET technologies may not be scalable beyond the 32 nanometer technology node.

For these and other reasons there is a need for the present invention.

SUMMARY

The present disclosure describes an integrated circuit including a non-planar structure and a waveguide. One embodiment provides an integrated circuit including a first non-planar structure and a waveguide configured to provide electromagnetic waves to the first non-planar structure. The first non-planar structure provides a first signal in response to at least some of the electromagnetic waves.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
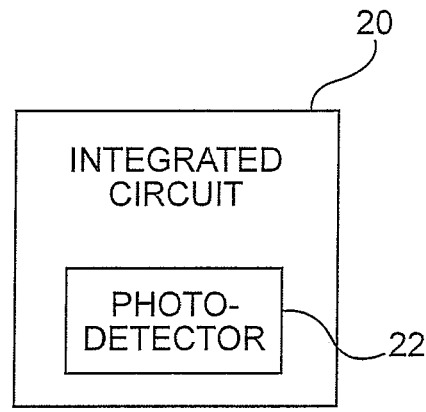
FIG. 1 is a diagram illustrating one embodiment of an integrated circuit according to the present invention.

FIG. 1 is a diagram illustrating one embodiment of an integrated circuit 20 according to the present invention. Integrated circuit 20 is manufactured via a non-planar technology. In one embodiment, integrated circuit 20 is manufactured via a non-planar multi-gate MOSFET technology, such as a multi-gate field effect transistor (MuGFET) technology, including FinFET technology and Trigate technology. In one embodiment, integrated circuit 20 is manufactured via a FinFET technology such as a Pi-gate technology, an Omega-gate technology, or an ITFET technology.

Integrated circuit 20 includes a photodetector 22 that includes a non-planar structure and a waveguide. The non-planar structure includes a photon detection region and the waveguide provides electromagnetic waves to the photon detection region. In response to at least some of the electromagnetic waves, the non-planar structure provides photo current. In one embodiment, the non-planar structure is a fin structure. In one embodiment, the waveguide is substantially perpendicular to the non-planar structure at the intersection of the waveguide and the non-planar structure.

In one embodiment, the non-planar structure is substantially perpendicular to a substrate and the waveguide is substantially parallel to the substrate and perpendicular to the non-planar structure. This separates the light coupling between the waveguide and the photon detection region from the parasitic light absorption of the substrate and provides good light coupling between the waveguide and the photon detection region and poor light coupling between the waveguide and the substrate.

In one embodiment, the photon detection region includes a depletion region of a p-n junction photodiode. In one embodiment, the photon detection region includes an intrinsic region of a p-i-n photodiode. In one embodiment, the photon detection region includes an absorption region of an avalanche diode.

In one embodiment, integrated circuit 20 includes non-planar multi-gate MOSFETs. Each of the MOSFETs includes multiple gates that are controlled via a single gate electrode or multiple independent gate electrodes. If controlled via a single gate electrode, the multiple gates act as a single gate. In each non-planar multi-gate MOSFET, a channel is surrounded by multiple gate surfaces, which allows for more effective suppression of off-state leakage current and enhanced on-state drive current. These advantages lead to lower power consumption and enhanced device performance.

In one embodiment, photodetector 22 includes a non-planar structure in a photodiode and a transistor. In one embodiment, photodetector 22 includes a non-planar structure in a photodiode and a multi-gate MOSFET. In one embodiment, photodetector 22 includes a non-planar structure in a photodiode and a junction field effect transistor (JFET). In one embodiment, photodetector 22 includes an interrupted non-planar structure having a photodiode on one side of the interruption and a transistor on the other side.

In one embodiment, photodetector 22 includes a first non-planar structure in a photodiode and a second non-planar structure in a transistor. In one embodiment, photodetector 22 includes a first non-planar structure in a photodiode and a second non-planar structure in a multi-gate MOSFET. In one embodiment, photodetector 22 includes a first non-planar structure in a photodiode and a second non-planar structure in a multi-gate MOSFET, where the photodiode is coupled to at least one of the gates of the multi-gate MOSFET.

In one embodiment, photodetector 22 includes multiple non-planar structures. In one embodiment, photodetector 22 includes multiple non-planar structures in a photodiode. In one embodiment, photodetector 22 includes multiple non-planar structures in a transistor.

In one embodiment, photodetector 22 includes a photodiode having multiple cathodes or anodes electrically coupled to the drain, gate, or source of a transistor. In one embodiment, photodetector 22 includes a photodiode having multiple cathodes or anodes in multiple non-planar structures electrically coupled to the drain, gate, or source of a transistor.

In one embodiment, photodetector 22 includes multiple non-planar structures, where each of the non-planar structures includes a photon detection region. The waveguide provides electromagnetic waves to the non-planar structures and each of the non-planar structures provides photo current in response to a different frequency range of the electromagnetic waves.

Figure 2:
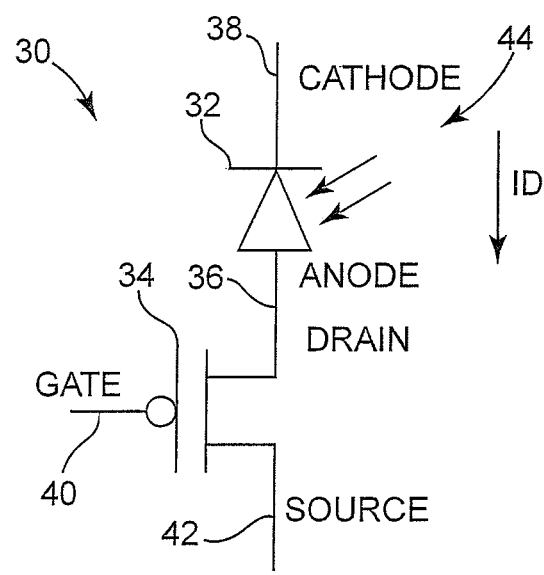
FIG. 2 is a diagram illustrating one embodiment of a photodiode circuit.

FIG. 2 is a diagram illustrating one embodiment of a photodiode circuit 30. Photodiode circuit 30 is manufactured via a non-planar MOSFET technology. In one embodiment, integrated circuit 20 includes photodiode circuit 30. In one embodiment, photodetector 22 includes photodiode circuit 30.

Photodiode circuit 30 is manufactured via a non-planar process. In one embodiment, photodiode circuit 30 is manufactured via a silicon-on-insulator (SOI) process. In one embodiment, photodiode circuit 30 is manufactured via a non-planar multi-gate MOSFET technology. In one embodiment, photodiode circuit 30 is manufactured via a p-channel metal oxide semiconductor (PMOS) process. In one embodiment, photodiode circuit 30 is manufactured via an n-channel metal oxide semiconductor (NMOS) process. In one embodiment, photodiode circuit 30 is manufactured via a complementary metal oxide semiconductor (CMOS) process.

Photodiode circuit 30 is used to detect electromagnetic waves. In one embodiment, photodiode circuit 30 is used in an optocoupler application. In one embodiment, photodiode circuit 30 is used in a solar cell application.

Photodiode circuit 30 includes a photodiode 32 and a PMOS transistor 34. Photodiode 32 and PMOS transistor 34 are electrically coupled via a shared anode/drain region 36. Also, photodiode 32 includes cathode 38 and PMOS transistor 34 includes gate 40 and source 42.

In operation, electromagnetic waves or light 44 falls on photodiode 32, which creates photo current ID in photodiode 32. Photo current ID flows from cathode 38 to the anode/drain region 36. If gate 40 is pulled low to increase conduction of PMOS transistor 34, photo current ID flows from the anode/drain region 36 to source 42. The magnitude of the photo current ID is proportional to the amount of light falling on photodiode 32.

Figure 3:
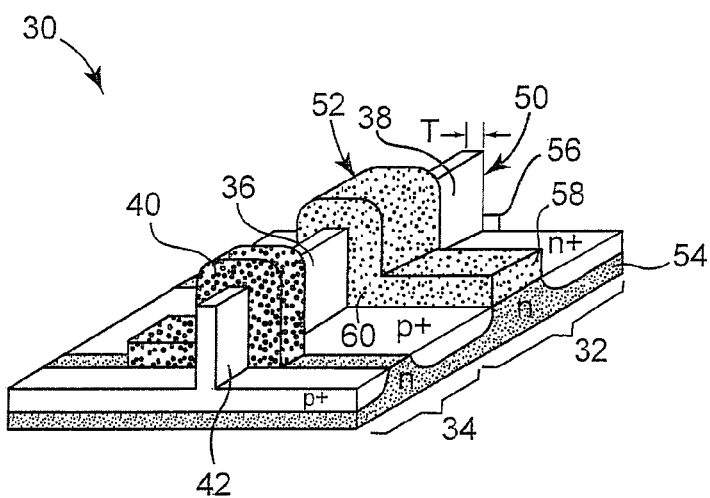
FIG. 3 is a perspective view of one embodiment of the photodiode circuit of FIG. 2.

FIG. 3 is a perspective view of one embodiment of photodiode circuit 30 of FIG. 2. Photodiode circuit 30 includes photodiode 32 and PMOS transistor 34. Photodiode 32 includes the shared anode/drain region 36 and cathode 38. PMOS transistor 34 includes the shared anode/drain region 36, gate 40, and source 42.

Photodiode circuit 30 is manufactured via a non-planar multi-gate MOSFET technology and includes non-planar structure 50 and waveguide 52. Non-planar structure 50 includes cathode 38, a photon detection region under waveguide 52, anode/drain region 36, a channel under gate 40, and source 42. In one embodiment, non-planar structure 50 is a fin structure. In one embodiment, non-planar structure 50 includes crystalline silicon. In one embodiment, non-planar structure 50 includes amorphous silicon. In one embodiment, non-planar structure 50 includes poly-silicon. In other embodiments, non-planar structure 50 includes one or more of Ge, SiGe, GaAs, InGaAsP, InGaAs, and combinations thereof.

Waveguide 52 is a guide for electromagnetic waves or light to non-planar structure 50 and the photon detection region of photodiode 32. In one embodiment, waveguide 52 includes silicon dioxide. In one embodiment, waveguide 52 includes another suitable light guide material.

Photodiode 32 includes cathode 38, the photon detection region, and the shared anode/drain region 36. Cathode 38 is part of non-planar structure 50 and a heavily doped n+ region that extends down to and into an n-doped substrate or n-doped well region 54, referred to herein as substrate 54. Anode/drain region 36 is part of non-planar structure 50 and a heavily doped p+ region that extends down to and into substrate 54. The photon detection region is part of non-planar structure 50 and situated under waveguide 52 and between cathode 38 and anode/drain region 36. In one embodiment, the photon detection region includes the depletion region of a p-n junction. In one embodiment, the photon detection region includes the intrinsic region of a p-i-n photodiode. In one embodiment, the photon detection region includes the absorption region of an avalanche diode.

PMOS transistor 34 is a non-planar multi-gate MOSFET that includes anode/drain region 36, gate 40, the channel under gate 40, and source 42. Anode/drain region 36 and source 42 are part of non-planar structure 50 and are the heavily doped p+ regions that extend down to and into substrate 54. The channel is an n-doped region that is part of non-planar structure 50 and situated under gate 40 and between anode/drain region 36 and source 42. Gate 40 is a multi-gate MOSFET gate structure situated over non-planar structure 50 and over the channel. Gate 40 includes multiple gate surfaces or multiple gates around the channel in non-planar structure 50. The multiple gates are controlled via a single gate electrode and the multiple gates act as a single gate. The multiple gate surfaces allow for more effective suppression of off-state leakage current and enhanced on-state drive current, which leads to lower power consumption and enhanced device performance. In one embodiment, gate 40 is a poly-silicon gate structure. In other embodiments, gate 40 is any suitable conductive material in a gate structure.

Non-planar structure 50 is substantially vertical and substrate 54 is substantially horizontal, such that non-planar structure 50 is substantially perpendicular at 56 to substrate 54. Waveguide 52 is substantially horizontal and parallel at 58 to substrate 54, such that the horizontal waveguide 52 is substantially perpendicular to the vertical non-planar structure 50 at 60 where waveguide 52 intersects non-planar structure 50. Waveguide 52 guides electromagnetic waves or light to non-planar structure 50 and the photon detection region of photodiode 32. The electromagnetic waves travel substantially perpendicular to non-planar structure 50 and parallel to substrate 54 in waveguide 52. This separates the light coupling between waveguide 52 and the photon detection region from the parasitic light absorption of substrate 54 and provides good light coupling between waveguide 52 and the photon detection region and poor light coupling between waveguide 52 and substrate 54.

Different wavelengths of light are detected via non-planar structures, such as non-planar structure 50, having different thicknesses T. Thus, different colors of light can be detected via non-planar structures having different thicknesses, as shown in Table 1.

TABLE 1

| COLOR | WAVELENGTH (nm) | THICKNESS (T) |
|---|---|---|
| Ultra-violet (near) | 300-390 | 10-100 |
| Violet | 390-455 | 100-200 |
| Blue | 455-492 | 200-500 |
| Green | 492-577 | 500-1500 |
| Yellow | 577-597 | 1500-2000 |
| Orange | 597-622 | 2000-3000 |
| Red | 622-770 | 3000-8000 |
| Infra-red (near) | 770-1500 | >8000 |

In operation, waveguide 52 guides electromagnetic waves or light to fall on the photon detection region of photodiode 32, which creates photo current in photodiode 32. The photo current flows from cathode 38 to the anode/drain region 36. If gate 40 is pulled low to increase conduction of PMOS transistor 34, the photo current flows from the anode/drain region 36 to source 42. The magnitude of the photo current is proportional to the amount of light falling on photodiode 32.

Figure 4:
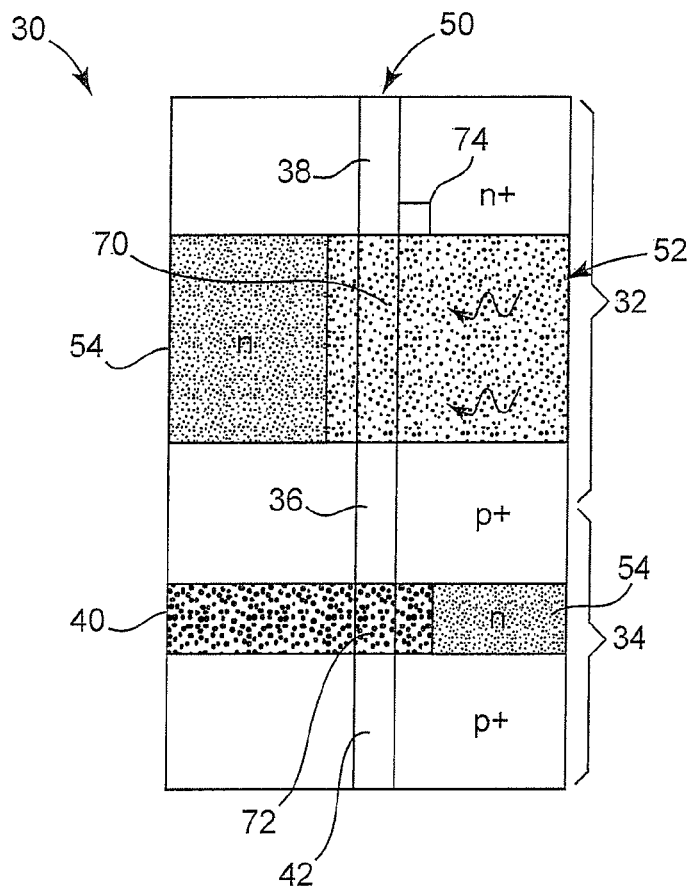
FIG. 4 is a top view of one embodiment of the layout of the photodiode circuit of FIGS. 2 and 3.

FIG. 4 is a top view of one embodiment of the layout of photodiode circuit 30 of FIGS. 2 and 3. Photodiode circuit 30 includes photodiode 32 and PMOS transistor 34. Photodiode 32 includes cathode 38, shared anode/drain region 36, and photon detection region 70 under waveguide 52. PMOS transistor 34 includes shared anode/drain region 36, gate 40, channel 72 under gate 40, and source 42.

Photodiode circuit 30 is manufactured via the non-planar multi-gate MOSFET technology and includes non-planar structure 50 and waveguide 52. Non-planar structure 50 includes cathode 38, photon detection region 70 under waveguide 52, anode/drain region 36, channel 72 under gate 40, and source 42. Cathode 38 is part of non-planar structure 50 and the heavily doped n+ region bordered by the n-doped substrate 54. The photon detection region 70 is part of non-planar structure 50 and situated under waveguide 52 and between anode/drain region 36 and cathode 38. Anode/drain region 36 is part of non-planar structure 50 and the heavily doped p+ region bordered by n-doped substrate 54. Channel 72 is an n-doped region that is part of non-planar structure 50 and situated under gate 40 and between source 42 and anode/drain region 36. Source 42 is part of non-planar structure 50 and a heavily doped p+ region bordered by n-doped substrate 54.

Gate 40 is a multi-gate MOSFET gate structure situated over non-planar structure 50 and channel 72. Gate 40 includes multiple gate surfaces on channel 72 in non-planar structure 50. The multiple gates are controlled via a single gate electrode to act as a single gate. The multiple gate surfaces allow for more effective suppression of off-state leakage current and enhanced on-state drive current, which leads to lower power consumption and enhanced device performance.

Non-planar structure 50 is substantially vertical and perpendicular at 56 to substrate 54, and waveguide 52 is substantially horizontal and parallel at 58 to substrate 54 and substantially perpendicular to non-planar structure 50 at 60 where waveguide 52 intersects non-planar structure 50, as shown in FIG. 3. In addition, waveguide 52 is substantially perpendicular to non-planar structure 50 in the horizontal plane, as indicated at 74. As stated above, waveguide 52 guides electromagnetic waves or light to non-planar structure 50 and the photon detection region 70 of photodiode 32. The electromagnetic waves travel perpendicular to non-planar structure 50 and parallel to substrate 54 in waveguide 52, which separates the light coupling between waveguide 52 and photon detection region 70 from the parasitic light absorption of substrate 54. This provides good light coupling between waveguide 52 and photon detection region 70 and poor light coupling between waveguide 52 and substrate 54.

In operation, waveguide 52 guides electromagnetic waves or light to fall on the photon detection region 70 of photodiode 32, which creates photo current in photodiode 32. The photo current flows from cathode 38 to anode/drain region 36. If gate 40 is pulled low to increase conduction of PMOS transistor 34, the photo current flows from anode/drain region 36 to source 42. The magnitude of the photo current is proportional to the amount of light falling on photodiode 32.

Figure 5:
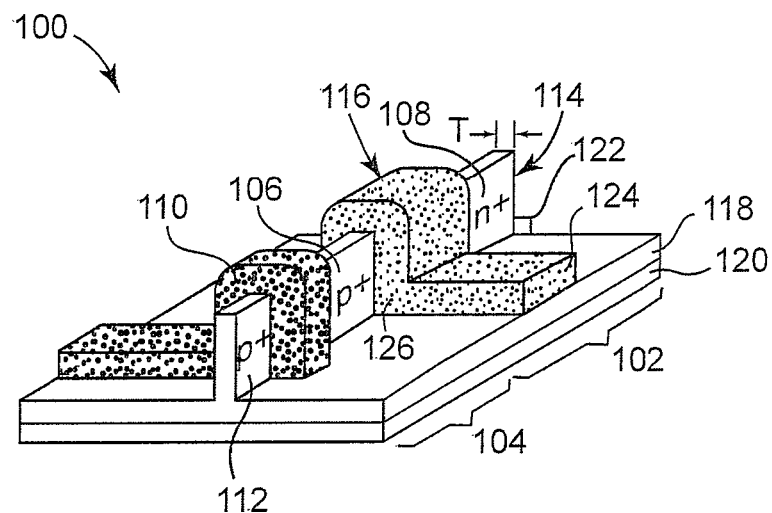
FIG. 5 is a perspective view of one embodiment of a photodiode circuit manufactured via a silicon-on-insulator (SOI) process.

FIG. 5 is a perspective view of one embodiment of a photodiode circuit 100 manufactured via a silicon-on-insulator (SOI) process. Photodiode circuit 100 has a circuit topology that is similar to photodiode circuit 30 of FIG. 2.

Photodiode circuit 100 includes a photodiode 102 and a PMOS transistor 104. Photodiode 102 includes a shared anode/drain region 106 and a cathode 108. PMOS transistor 104 includes the shared anode/drain region 106, a gate 110, and a source 112.

Photodiode circuit 100 is manufactured via the SOI process and a non-planar multi-gate technology. Photodiode circuit 100 includes non-planar structure 114 and waveguide 116 situated on insulation layer 118. A substrate 120 supports insulation layer 118. Non-planar structure 114 is insulated from substrate 120 via insulation layer 118 and substrate 120 provides mechanical support for photodiode circuit 100. In one embodiment, insulation layer 118 includes an oxide. In one embodiment, insulation layer 118 includes a nitride. In one embodiment, substrate 120 is a silicon substrate. In one embodiment, non-planar structure 114 and waveguide 116 are supported via a plastic layer.

Non-planar structure 114 includes cathode 108, a photon detection region under waveguide 116, anode/drain region 106, a channel under gate 110, and source 112. In one embodiment, non-planar structure 114 is a fin structure. In one embodiment, non-planar structure 114 includes crystalline silicon. In one embodiment, non-planar structure 114 includes amorphous silicon. In one embodiment, non-planar structure 114 includes poly-silicon. In other embodiments, non-planar structure 114 includes one or more of Ge, SiGe, GaAs, InGaAsP, InGaAs, and combinations thereof.

Waveguide 116 is a guide for electromagnetic waves or light to non-planar structure 114 and the photon detection region of photodiode 102. In one embodiment, waveguide 116 includes silicon dioxide. In one embodiment, waveguide 116 includes another suitable light guide material.

Photodiode 102 includes cathode 108, the photon detection region, and the shared anode/drain region 106. Cathode 108 is part of non-planar structure 114 and is a heavily doped n+ region that extends down to insulation layer 118. Anode/drain region 106 is part of non-planar structure 114 and is a heavily doped p+ region that extends down to insulation layer 118. The photon detection region is part of non-planar structure 114 and situated under waveguide 116 and between cathode 108 and anode/drain region 106. In one embodiment, the photon detection region includes the depletion region of a p-n junction. In one embodiment, the photon detection region includes the intrinsic region of a p-i-n photodiode. In one embodiment, the photon detection region includes the absorption region of an avalanche diode.

PMOS transistor 104 is a non-planar multi-gate MOSFET that includes anode/drain region 106, gate 110, the channel under gate 110, and source 112. Anode/drain region 106 and source 112 are part of non-planar structure 114 and are heavily doped p+ regions that extend down to insulation layer 118. The channel is an n-doped region that is part of non-planar structure 114 and situated under gate 110 and between anode/drain region 106 and source 112. Gate 110 is a multi-gate MOSFET gate structure situated over non-planar structure 114 and over the channel. Gate 110 includes multiple gate surfaces or multiple gates around the channel in non-planar structure 114. The multiple gates are controlled via a single gate electrode and the multiple gates act as a single gate. The multiple gate surfaces allow for more effective suppression of off-state leakage current and enhanced on-state drive current, which leads to lower power consumption and enhanced device performance. In one embodiment, gate 110 is a poly-silicon gate structure. In other embodiments, gate 110 is any suitable conductive material in a gate structure.

Non-planar structure 114 is substantially vertical and substrate 120 is substantially horizontal, such that non-planar structure 114 is substantially perpendicular at 122 to substrate 120. Waveguide 116 is substantially horizontal and parallel at 124 to substrate 120, such that the horizontal waveguide 116 is substantially perpendicular to the vertical non-planar structure 114 at 126, where waveguide 116 intersects non-planar structure 114. Waveguide 116 guides electromagnetic waves or light to non-planar structure 114 and the photon detection region of photodiode 102. The electromagnetic waves travel substantially perpendicular to non-planar structure 114 and parallel to substrate 120 in waveguide 116. This separates the light coupling between waveguide 116 and the photon detection region from the parasitic light absorption of insulation layer 118 and substrate 120 and provides good light coupling between waveguide 116 and the photon detection region and poor light coupling between waveguide 116 and insulation layer 118 and substrate 120.

Different wavelengths of light are detected via non-planar structures, such as non-planar structure 114, having different thicknesses T. Thus, different colors of light can be detected via non-planar structures having different thicknesses, as shown in Table 1.

In operation, waveguide 116 guides electromagnetic waves or light to fall on the photon detection region of photodiode 102, which creates photo current in photodiode 102. The photo current flows from cathode 108 to the anode/drain region 106. If gate 110 is pulled low to increase conduction of PMOS transistor 104, the photo current flows from the anode/drain region 106 to source 112. The magnitude of the photo current is proportional to the amount of light falling on photodiode 102.

Figure 6:
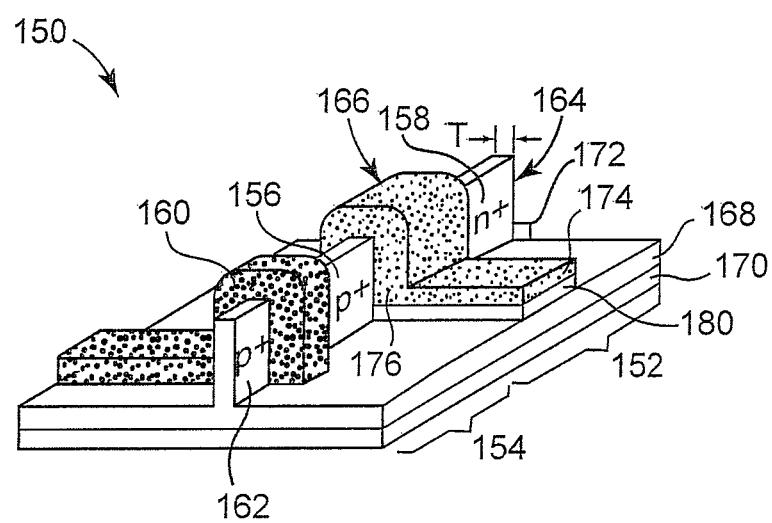
FIG. 6 is a perspective view of one embodiment of a photodiode circuit manufactured via an SOI process and including a reflective layer under the waveguide.

FIG. 6 is a perspective view of one embodiment of a photodiode circuit 150 manufactured via an SOI process and including a reflective layer 180 between waveguide 166 and insulation layer 168. Photodiode circuit 150 has a circuit topology that is similar to photodiode circuit 30 of FIG. 2.

Photodiode circuit 150 includes photodiode 152 and PMOS transistor 154. Photodiode 152 includes shared anode/drain region 156 and cathode 158. PMOS transistor 154 includes the shared anode/drain region 156, a gate 160, and a source 162. Photodiode circuit 150 is similar to photodiode circuit 100 of FIG. 5, except photodiode circuit 150 includes reflective layer 180.

Photodiode circuit 150 is manufactured via the SOI process and a non-planar multi-gate technology. Photodiode circuit 150 includes non-planar structure 164 and reflective layer 180 on insulation layer 168. Waveguide 166 is situated on reflective layer 180 and over non-planar structure 164. A substrate 170 supports insulation layer 168. Non-planar structure 164 is insulated from substrate 170 via insulation layer 168 and substrate 170 provides mechanical support for photodiode circuit 150. In one embodiment, insulation layer 168 includes an oxide. In one embodiment, insulation layer 168 includes a nitride. In one embodiment, substrate 170 is a silicon substrate. In one embodiment, non-planar structure 164 and reflective layer 180 are supported via a plastic layer.

Non-planar structure 164 includes cathode 158, a photon detection region under waveguide 166, anode/drain region 156, a channel under gate 160, and source 162. In one embodiment, non-planar structure 164 is a fin structure. In one embodiment, non-planar structure 164 includes crystalline silicon. In one embodiment, non-planar structure 164 includes amorphous silicon. In one embodiment, non-planar structure 164 includes poly-silicon. In other embodiments, non-planar structure 164 includes one or more of Ge, SiGe, GaAs, InGaAsP, InGaAs, and combinations thereof.

Waveguide 166 is a guide for electromagnetic waves or light to non-planar structure 164 and the photon detection region of photodiode 152. Reflective layer 180 reflects electromagnetic waves back into waveguide 166 and prevents absorption of the electromagnetic waves by insulation layer 168 and substrate 170. In one embodiment, waveguide 166 includes silicon dioxide. In one embodiment, waveguide 166 includes another suitable light guide material.

Photodiode 152 includes cathode 158, the photon detection region, and the shared anode/drain region 156. Cathode 158 is part of non-planar structure 164 and is a heavily doped n+ region that extends down to insulation layer 168. Anode/drain region 156 is part of non-planar structure 164 and is a heavily doped p+ region that extends down to insulation layer 168. The photon detection region is part of non-planar structure 164 and situated under waveguide 166 and between cathode 158 and anode/drain region 156. In one embodiment, the photon detection region includes the depletion region of a p-n junction. In one embodiment, the photon detection region includes the intrinsic region of a p-i-n photodiode. In one embodiment, the photon detection region includes the absorption region of an avalanche diode.

PMOS transistor 154 is a non-planar multi-gate MOSFET that includes anode/drain region 156, gate 160, the channel under gate 160, and source 162. Anode/drain region 156 and source 162 are part of non-planar structure 164 and are heavily doped p+ regions that extend down to insulation layer 168. The channel is an n-doped region that is part of non-planar structure 164 and situated under gate 160 and between anode/drain region 156 and source 162. Gate 160 is a multi-gate MOSFET gate structure situated over non-planar structure 164 and over the channel. Gate 160 includes multiple gate surfaces or multiple gates around the channel in non-planar structure 164. The multiple gates are controlled via a single gate electrode and the multiple gates act as a single gate. The multiple gate surfaces allow for more effective suppression of off-state leakage current and enhanced on-state drive current, which leads to lower power consumption and enhanced device performance. In one embodiment, gate 160 is a poly-silicon gate structure. In other embodiments, gate 160 is any suitable conductive material in a gate structure.

Non-planar structure 164 is substantially vertical and substrate 170 is substantially horizontal, such that non-planar structure 164 is substantially perpendicular at 172 to substrate 170. Waveguide 166 is substantially horizontal and parallel at 174 to substrate 170, such that the horizontal waveguide 166 is substantially perpendicular to the vertical non-planar structure 164 at 176, where waveguide 166 intersects non-planar structure 164. Waveguide 166 guides electromagnetic waves or light to non-planar structure 164 and the photon detection region of photodiode 152. The electromagnetic waves travel substantially perpendicular to non-planar structure 164 and parallel to substrate 170 in waveguide 166. Reflective layer 180 reflects the electromagnetic waves back into waveguide 166 and prevents absorption of the electromagnetic waves by insulation layer 168 and substrate 170. The light coupling between waveguide 166 and the photon detection region is separated from the parasitic light absorption of insulation layer 168 and substrate 170. This results in good light coupling between waveguide 166 and the photon detection region and poor light coupling between waveguide 166 and the insulation layer 168 and substrate 170.

Different wavelengths of light are detected via non-planar structures, such as non-planar structure 164, having different thicknesses T. Thus, different colors of light can be detected via non-planar structures having different thicknesses, as shown in Table 1.

In operation, waveguide 166 guides electromagnetic waves or light to fall on the photon detection region of photodiode 152, which creates photo current in photodiode 152. Reflective layer 180 reflects the electromagnetic waves back into waveguide 166 and prevents absorption of the electromagnetic waves by insulation layer 168 and substrate 170. The photo current flows from cathode 158 to the anode/drain region 156. If gate 160 is pulled low to increase conduction of PMOS transistor 154, the photo current flows from the anode/drain region 156 to source 162. The magnitude of the photo current is proportional to the amount of light falling on photodiode 152.

Figure 7:
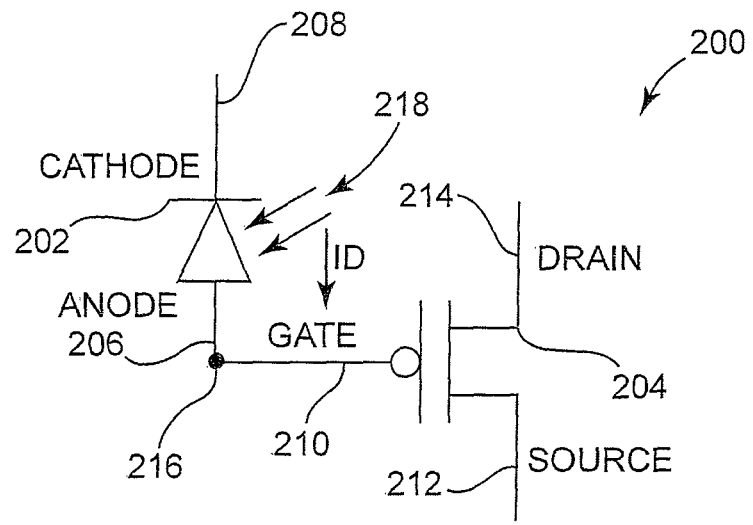
FIG. 7 is a diagram illustrating one embodiment of a photodiode switch.

FIG. 7 is a diagram illustrating one embodiment of a photodiode switch 200. Photodiode switch 200 is manufactured via a non-planar MOSFET technology. In one embodiment, integrated circuit 20 includes photodiode switch 200. In one embodiment, photodetector 22 includes photodiode switch 200.

Photodiode switch 200 is manufactured via a non-planar process. In one embodiment, photodiode switch 200 is manufactured via an SOI process. In one embodiment, photodiode switch 200 is manufactured via a non-planar multi-gate MOSFET technology. In one embodiment, photodiode switch 200 is manufactured via a PMOS process. In one embodiment, photodiode switch 200 is manufactured via an NMOS process. In one embodiment, photodiode switch 200 is manufactured via a CMOS process.

Photodiode switch 200 is used to detect electromagnetic waves. In one embodiment, photodiode switch 200 is used in an optocoupler application. In one embodiment, photodiode circuit 200 is used in a solar cell application.

Photodiode switch 200 includes a photodiode 202 and a PMOS transistor 204. Photodiode 202 includes anode 206 and cathode 208. PMOS transistor 204 includes gate 210, source 212, and drain 214. Anode 206 is electrically coupled to gate 210 via a conductive path at 216. In one embodiment, photodiode switch 200 includes a resistor electrically coupled between gate 210 and a reference, such as ground.

In operation, electromagnetic waves or light 218 falls on photodiode 202, which creates photo current ID in photodiode 202. The magnitude of the photo current ID is proportional to the amount of light falling on photodiode 202. Photo current ID flows from cathode 208 to anode 206 and gate 210. Photo current ID charges gate 210 to a high voltage level that decreases conduction of PMOS transistor 204. If the amount of light falling on photodiode 202 is reduced or eliminated, the charge on gate 210 falls to a lower voltage level that increases conduction of PMOS transistor 204.

Figure 8:
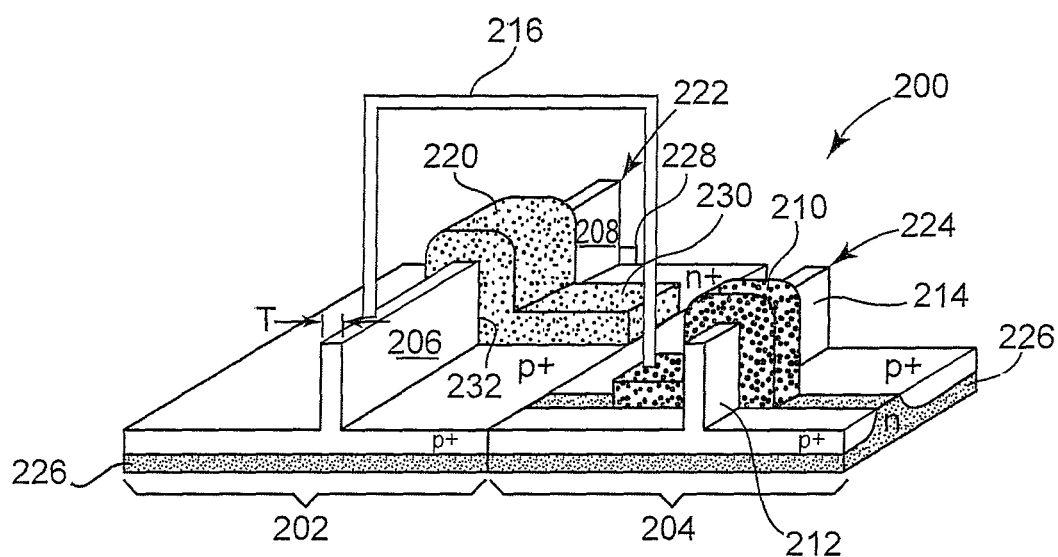
FIG. 8 is a perspective view of one embodiment of the photodiode switch of FIG. 7.

FIG. 8 is a perspective view of one embodiment of photodiode switch 200 of FIG. 7. Photodiode switch 200 includes a photodiode 202 and a PMOS transistor 204. Photodiode 202 includes anode 206 and cathode 208. PMOS transistor 204 includes gate 210, source 212, and drain 214. Anode 206 is electrically coupled to gate 210 via conductive path 216. In one embodiment, photodiode switch 200 includes a resistor electrically coupled between gate 210 and a reference, such as ground.

Photodiode switch 200 is manufactured via a non-planar multi-gate MOSFET technology and includes waveguide 220, first non-planar structure 222, and second non-planar structure 224. In one embodiment, first and second non-planar structures 222 and 224 are fin structures. In one embodiment, first and second non-planar structures 222 and 224 include crystalline silicon. In one embodiment, first and second non-planar structures 222 and 224 include amorphous silicon. In one embodiment, first and second non-planar structures 222 and 224 include poly-silicon. In other embodiments, first and second non-planar structures 222 and 224 include one or more of Ge, SiGe, GaAs, InGaAsP, InGaAs, and combinations thereof.

First non-planar structure 222 includes cathode 208, a photon detection region under waveguide 220, and anode 206. Second non-planar structure 224 includes drain 214, a channel under gate 210, and source 212. Waveguide 220 guides electromagnetic waves or light to first non-planar structure 222 and the photon detection region of photodiode 202. In one embodiment, waveguide 220 includes silicon dioxide. In one embodiment, waveguide 220 includes another suitable light guide material.

Photodiode 202 includes cathode 208, the photon detection region, and anode 206. Cathode 208 is part of first non-planar structure 222 and a heavily doped n+ region that extends down to and into the n-doped substrate or n-doped well region 226, referred to herein as substrate 226. Anode 206 is part of first non-planar structure 222 and the heavily doped p+ region that extends down to and into substrate 226. The photon detection region is part of first non-planar structure 222 and situated under waveguide 220 and between cathode 208 and anode 206. In one embodiment, the photon detection region includes the depletion region of a p-n junction. In one embodiment, the photon detection region includes the intrinsic region of a p-i-n photodiode. In one embodiment, the photon detection region includes the absorption region of an avalanche diode.

PMOS transistor 204 is a non-planar multi-gate MOSFET that includes drain 214, gate 210, the channel under gate 210, and source 212. Drain 214 and source 212 are part of second non-planar structure 224 and the heavily doped p+ regions that extend down to and into substrate 226. The channel is an n-doped region that is part of second non-planar structure 224 and situated under gate 210 and between drain 214 and source 212. Gate 210 is a multi-gate MOSFET gate structure situated over second non-planar structure 224 and over the channel. Gate 210 includes multiple gate surfaces or multiple gates around the channel in second non-planar structure 224. The multiple gates are controlled via a single gate electrode and the multiple gates act as a single gate. The multiple gate surfaces allow for more effective suppression of off-state leakage current and enhanced on-state drive current, which leads to lower power consumption and enhanced device performance. In one embodiment, gate 210 is a poly-silicon gate structure. In other embodiments, gate 210 is any suitable conductive material in a gate structure.

First non-planar structure 222 is substantially vertical or perpendicular at 228 to substrate 226, and waveguide 220 is substantially parallel at 230 to substrate 226. Thus, waveguide 220 is substantially perpendicular to first non-planar structure 222 at 232, where waveguide 220 intersects first non-planar structure 222. Waveguide 220 guides electromagnetic waves or light to first non-planar structure 222 and the photon detection region of photodiode 202. The electromagnetic waves travel perpendicular to first non-planar structure 222 and parallel to substrate 226 in waveguide 220. This separates the light coupling between waveguide 220 and the photon detection region from the parasitic light absorption of substrate 226 and provides good light coupling between waveguide 220 and the photon detection region and poor light coupling between waveguide 220 and substrate 226.

Different wavelengths of light are detected via non-planar structures, such as first non-planar structure 222, having different thicknesses T. Thus, different colors of light can be detected via non-planar structures, such as first non-planar structure 222, having different thicknesses as shown in Table 1.

In operation, waveguide 220 guides electromagnetic waves or light to fall on the photon detection region of photodiode 202, which creates photo current in photodiode 202. The magnitude of the photo current is proportional to the amount of light falling on photodiode 202. Photo current flows from cathode 208 to anode 206 and gate 210. The photo current charges gate 210 to a high voltage level that decreases conduction of PMOS transistor 204. If the amount of light falling on photodiode 202 is reduced or eliminated, the charge on gate 210 falls to a lower voltage level that increases conduction of PMOS transistor 204.

Figure 9:
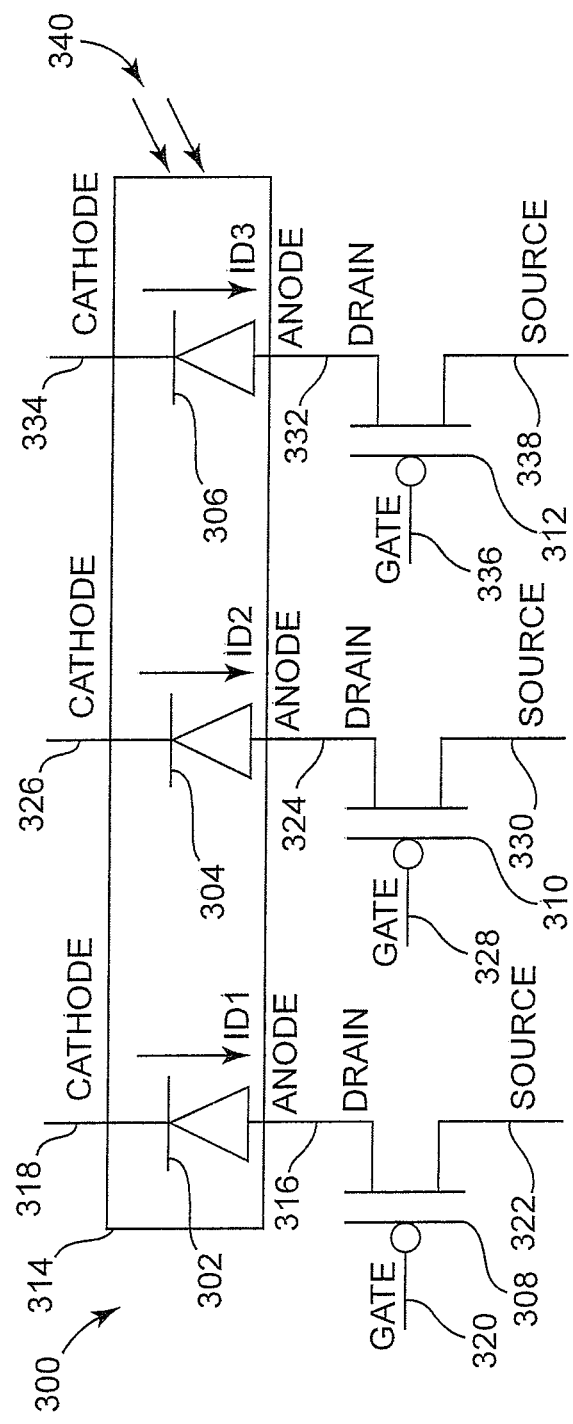
FIG. 9 is a diagram illustrating one embodiment of a photodiode color sensor.

FIG. 9 is a diagram illustrating one embodiment of a photodiode color sensor 300. Sensor 300 is manufactured via a non-planar MOSFET technology. In one embodiment, integrated circuit 20 includes sensor 300. In one embodiment, photodetector 22 includes sensor 300.

Sensor 300 is manufactured via a non-planar process. In one embodiment, sensor 300 is manufactured via a silicon-on-insulator (SOI) process. In one embodiment, sensor 300 is manufactured via a non-planar multi-gate MOSFET technology. In one embodiment, sensor 300 is manufactured via a PMOS process. In one embodiment, sensor 300 is manufactured via an NMOS process. In one embodiment, sensor 300 is manufactured via a CMOS process.

Sensor 300 includes a first photodiode 302, a second photodiode 304, a third photodiode 306, a first PMOS transistor 308, a second PMOS transistor 310, a third PMOS transistor 312, and a waveguide 314. First photodiode 302 and first PMOS transistor 308 are electrically coupled via a first shared anode/drain region 316. Also, first photodiode 302 includes first cathode 318 and first PMOS transistor 308 includes first gate 320 and first source 322. Second photodiode 304 and second PMOS transistor 310 are electrically coupled via a second shared anode/drain region 324. Also, second photodiode 304 includes second cathode 326 and second PMOS transistor 310 includes second gate 328 and second source 330. Third photodiode 306 and third PMOS transistor 312 are electrically coupled via a third shared anode/drain region 332. Also, third photodiode 306 includes third cathode 334 and third PMOS transistor 312 includes third gate 336 and third source 338. In one embodiment, gates 320, 328, and 336 are electrically coupled together to receive the same gate signal.

In operation, waveguide 314 receives electromagnetic waves or light at 340 and guides the light to photodiodes 302, 304, and 306. If the light wavelengths are shorter wavelengths, the light is absorbed via third photodiode 306, which creates a photo current ID3 in third photodiode 306. Photo current ID3 flows from third cathode 334 to third anode/drain region 332. If third gate 336 is pulled low to increase conduction of third PMOS transistor 312, photo current ID3 flows from third anode/drain region 332 to third source 338. If the light wavelengths are medium length wavelengths, the light is absorbed via second photodiode 304, which creates a photo current ID2 in second photodiode 304. Photo current ID2 flows from second cathode 326 to second anode/drain region 324. If second gate 328 is pulled low to increase conduction of second PMOS transistor 310, photo current ID2 flows from second anode/drain region 324 to second source 330. If the light wavelengths are longer wavelengths, the light is absorbed via first photodiode 302, which creates a photo current ID1 in first photodiode 302. Photo current ID1 flows from first cathode 318 to first anode/drain region 316. If first gate 320 is pulled low to increase conduction of first PMOS transistor 308, photo current ID1 flows from first anode/drain region 316 to first source 322. Thus, each of the photodiodes absorbs and responds to a different range of wavelengths to detect different colors. The magnitudes of the photo currents ID1, ID2, and ID3 are proportional to the wavelengths and the amount of light received via waveguide 314.

Figure 10:
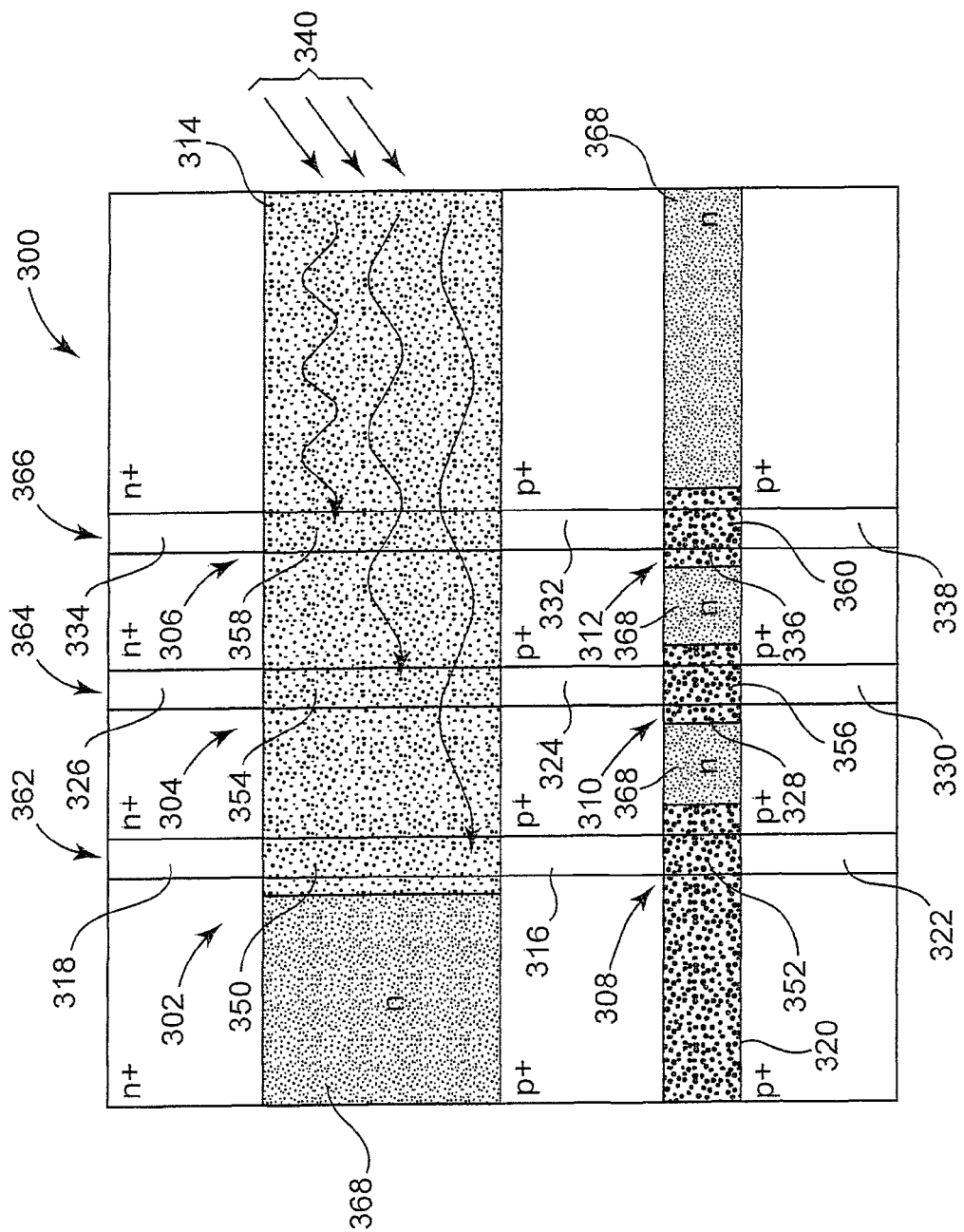
FIG. 10 is a top view of one embodiment of a layout of the photodiode color sensor of FIG. 9.

FIG. 10 is a top view of one embodiment of a layout of photodiode color sensor 300 of FIG. 9. Sensor 300 includes a first photodiode 302, a second photodiode 304, a third photodiode 306, a first PMOS transistor 308, a second PMOS transistor 310, a third PMOS transistor 312, and a waveguide 314.

First photodiode 302 includes first cathode 318, first shared anode/drain region 316, and first photon detection region 350 under waveguide 314. First PMOS transistor 308 includes first shared anode/drain region 316, first gate 320, first channel 352 under first gate 320, and first source 322. Second photodiode 304 includes second cathode 326, second shared anode/drain region 324, and second photon detection region 354 under waveguide 314. Second PMOS transistor 310 includes second shared anode/drain region 324, second gate 328, second channel 356 under gate 328, and second source 330. Third photodiode 306 includes third cathode 334, third shared anode/drain region 332, and third photon detection region 358 under waveguide 314. Third PMOS transistor 312 includes third shared anode/drain region 332, third gate 336, third channel 360 under third gate 336, and third source 338.

Sensor 300 is manufactured via a non-planar multi-gate MOSFET technology and includes first non-planar structure 362, second non-planar structure 364, third non-planar structure 366, and waveguide 314. In one embodiment, the non-planar structures 362, 364, and 366 are fin structures. In one embodiment, the non-planar structures 362, 364, and 366 include crystalline silicon. In one embodiment, the non-planar structures 362, 364, and 366 include amorphous silicon. In one embodiment, the non-planar structures 362, 364, and 366 include poly-silicon. In other embodiments, the non-planar structures 362, 364, and 366 include one or more of Ge, SiGe, GaAs, InGaAsP, InGaAs, and combinations thereof.

First non-planar structure 362 includes first cathode 318, first photon detection region 350 under waveguide 314, first shared anode/drain region 316, first channel 352 under first gate 320, and first source 322. First cathode 318 is part of first non-planar structure 362 and the heavily doped n+ region bordered by the n-doped substrate 368. The first photon detection region 350 is part of first non-planar structure 362 and situated under waveguide 314 and between first shared anode/drain region 316 and first cathode 318. First shared anode/drain region 316 is part of first non-planar structure 362 and the heavily doped p+ region bordered by n-doped substrate 368. First channel 352 is an n-doped region that is part of first non-planar structure 362 and situated under first gate 320 and between first source 322 and first shared anode/drain region 316. First source 322 is part of first non-planar structure 362 and a heavily doped p+region bordered by n-doped substrate 368.

First gate 320 is a multi-gate MOSFET gate structure situated over first non-planar structure 362 and first channel 352. First gate 320 includes multiple gate surfaces on first channel 352 in first non-planar structure 362. The multiple gates are controlled via a single gate electrode to act as a single gate. The multiple gate surfaces allow for more effective suppression of off-state leakage current and enhanced on-state drive current, which leads to lower power consumption and enhanced device performance.

Second non-planar structure 364 includes second cathode 326, second photon detection region 354 under waveguide 314, second shared anode/drain region 324, second channel 356 under second gate 328, and second source 330. Second cathode 326 is part of second non-planar structure 364 and the heavily doped n+ region bordered by the n-doped substrate 368. The second photon detection region 354 is part of second non-planar structure 364 and situated under waveguide 314 and between second shared anode/drain region 324 and second cathode 326. Second shared anode/drain region 324 is part of second non-planar structure 364 and the heavily doped p+ region bordered by n-doped substrate 368. Second channel 356 is an n-doped region that is part of second non-planar structure 364 and situated under second gate 328 and between second source 330 and second shared anode/drain region 324. Second source 330 is part of second non-planar structure 364 and a heavily doped p+ region bordered by n-doped substrate 368.

Second gate 328 is a multi-gate MOSFET gate structure situated over second non-planar structure 364 and second channel 356. Second gate 328 includes multiple gate surfaces on second channel 356 in second non-planar structure 364. The multiple gates are controlled via a single gate electrode to act as a single gate. The multiple gate surfaces allow for more effective suppression of off-state leakage current and enhanced on-state drive current, which leads to lower power consumption and enhanced device performance.

Third non-planar structure 366 includes third cathode 334, third photon detection region 358 under waveguide 314, third shared anode/drain region 332, third channel 360 under third gate 336, and third source 338. Third cathode 334 is part of third non-planar structure 366 and the heavily doped n+ region bordered by the n-doped substrate 368. The third photon detection region 358 is part of third non-planar structure 366 and situated under waveguide 314 and between third shared anode/drain region 332 and third cathode 334. Third shared anode/drain region 332 is part of third non-planar structure 366 and the heavily doped p+ region bordered by n-doped substrate 368. Third channel 360 is an n-doped region that is part of third non-planar structure 366 and situated under third gate 336 and between third source 338 and third shared anode/drain region 332. Third source 338 is part of third non-planar structure 366 and a heavily doped p+ region bordered by n-doped substrate 368.

Third gate 336 is a multi-gate MOSFET gate structure situated over third non-planar structure 366 and third channel 360. Third gate 336 includes multiple gate surfaces on third channel 360 in third non-planar structure 366. The multiple gates are controlled via a single gate electrode to act as a single gate. The multiple gate surfaces allow for more effective suppression of off-state leakage current and enhanced on-state drive current, which leads to lower power consumption and enhanced device performance. In one embodiment, gates 320, 328, and 336 are electrically coupled together to receive the same gate signal.

Waveguide 314 is substantially perpendicular to each of the non-planar structures 362, 364, and 366 where waveguide 314 intersects each of the non-planar structures 362, 364, and 366. Waveguide 314 guides electromagnetic waves or light to each of the non-planar structures 362, 364, and 366 and each of the corresponding photon detection regions 350, 354, and 358. The electromagnetic waves travel perpendicular to each of the non-planar structures 362, 364, and 366 and parallel to substrate 368 in waveguide 314. This separates the light coupling between waveguide 314 and each of the photon detection regions 350, 354, and 358 from the parasitic light absorption of substrate 368 and provides good light coupling between waveguide 314 and each of the photon detection regions 350, 354 and 358 and poor light coupling between waveguide 314 and substrate 368.

Different wavelengths of light are detected via non-planar structures, such as non-planar structures 362, 364, and 366, having different thicknesses. Thus, different colors of light can be detected via non-planar structures having different thicknesses, as shown in Table 1. In one embodiment, each of the non-planar structures 362, 364, and 366 have substantially the same thickness. In one embodiment, at least one of the non-planar structures 362, 364, and 366 has a different thickness than the others.

In operation, waveguide 314 receives electromagnetic waves or light at 340 and guides the light to photodiodes 302, 304, and 306. If the light wavelengths are shorter wavelengths, the light is absorbed via third photon detection region 358, which creates a photo current in third photodiode 306 that flows from third cathode 334 to third anode/drain region 332. If third gate 336 is pulled low to increase conduction of third PMOS transistor 312, the photo current flows from third anode/drain region 332 to third source 338. If the light wavelengths are medium length wavelengths, the light is absorbed via second photon detection region 354, which creates a photo current in second photodiode 304 that flows from second cathode 326 to second anode/drain region 324. If second gate 328 is pulled low to increase conduction of second PMOS transistor 310, the photo current flows from second anode/drain region 324 to second source 330. If the light wavelengths are longer wavelengths, the light is absorbed via first photon detection 350, which creates a photo current in first photodiode 302 that flows from first cathode 318 to first anode/drain region 316. If first gate 320 is pulled low to increase conduction of first PMOS transistor 308, the photo current flows from first anode/drain region 316 to first source 322. Thus, each of the photodiodes absorbs and responds to a different range of wavelengths to detect different colors. The magnitudes of the photo currents are proportional to the wavelengths and the amount of light received via waveguide 314.

Integrated circuit 20 and each of the photodiode circuits including photodiode circuit 30, photodiode circuit 100, photodiode circuit 150, photodiode switch 200, and photodiode color sensor 300 is manufactured via a non-planar multi-gate MOSFET technology that is scalable to the 32 nm technology node and beyond. These photodiode circuits and non-planar multi-gate MOSFETs are more compact than the planar photodiode circuits and MOSFETs, which results in higher device densities and smaller integrated circuits.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
a substrate;
an insulation layer positioned over the substrate;
a structure including a fin that extends substantially perpendicular to the insulation layer;
a waveguide that extends over the insulation layer to the fin, and extends over the fin, where the wave guide provides electromagnetic waves to the structure, and wherein the structure provides a signal in response to at least some of the electromagnetic waves.

2. The integrated circuit of claim 1, wherein the structure including the fin includes a transistor.

3. The integrated circuit of claim 1, comprising:
the waveguide having a first portion that extends over the insulation layer and a second portion that extends over the fin.

4. The integrated circuit of claim 3, wherein the second portion is in direct contact with the fin.

5. The integrated circuit of claim 3, comprising a reflective layer positioned between the first portion and the insulation layer.

6. The integrated circuit of claim 1, the structure including the fin comprising a photodiode having an anode region on one side of a photon detection region and a cathode region on the other side of the photon detection region.

7. The integrated circuit of claim 1, wherein the structure includes a transistor.

8. The integrated circuit of claim 1, comprising:
a photodiode having an anode and a cathode; and
the structure including a fin having a transistor comprising a metal oxide semiconductor field effect transistor having a drain/source region that shares one of the anode and the cathode.

9. The integrated circuit of claim 1, wherein the fin is a single fin in contact with the insulation layer.

10. An integrated circuit comprising:
a doped substrate layer;
a first structure that defines a photodiode, including a fin that extends substantially perpendicular to the doped substrate layer;
a waveguide that extends over the doped substrate layer to the fin, and extends over the fin, where the wave guide provides electromagnetic waves to the structure, and wherein the structure provides a signal in response to at least some of the electromagnetic waves; and
a second structure that includes a transistor having a gate, wherein the photodiode is coupled to the gate.

11. The integrated circuit of claim 10, wherein the transistor is a metal oxide semiconductor field effect transistor.

12. The integrated circuit of claim 10, wherein the second non-planar structure includes a second doped substrate layer and a fin extending substantially perpendicular to the doped substrate layer.

13. The integrated circuit of claim 10, wherein the waveguide is configured to provide electromagnetic waves to the second structure and the second structure provides a signal in response to at least some of the electromagnetic waves.

14. The integrated circuit of claim 10, wherein the first structure comprises a single fin.

15. The integrated circuit of claim 14, wherein the second structure comprises a single fin.

16. The integrated circuit of claim 10, wherein the first structure detects electromagnetic waves in a first frequency range and the second non-planar structure detects electromagnetic waves in a second frequency range that is different than the first frequency range.

17. The integrated circuit of claim 10, the second structure including a fin extending substantially perpendicular from a second doped substrate, wherein the second doped substrate and the first doped substrate form a common substrate.

18. An integrated circuit comprising:
a first photodiode, a second photodiode, and a third photodiode positioned on a substrate, each photodiode comprising:
a doped substrate layer;
an insulation layer positioned over the substrate;
a structure including a single fin that extends substantially perpendicular from the doped substrate layer;
a waveguide that extends on the doped substrate layer to the single fin and substantially perpendicular to the doped substrate layer as the waveguide extends over the single fin, the waveguide configured to provide electromagnetic waves to the single fin, wherein the single fin provides a signal in response to at least some of the electromagnetic waves.

19. The integrated circuit of claim 18, wherein each single fin includes a transistor.

20. The integrated circuit of claim 18, wherein the first photodiode, the second photodiode, and the third photodiode each absorb and respond to a different range of wavelengths to detect different colors.

* * * * *